United States Patent
Barkai

(10) Patent No.: US 11,032,642 B1
(45) Date of Patent: Jun. 8, 2021

(54) COMBINED FREQUENCY RESPONSE AND DYNAMIC RANGE CORRECTION FOR LOUDSPEAKERS

(71) Applicant: Nuvoton Technology Corporation, Hsin-chu (TW)

(72) Inventor: Ittai Barkai, Tel Aviv (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 16/813,874

(22) Filed: Mar. 10, 2020

(51) Int. Cl.
*H04R 3/04* (2006.01)
*H03G 5/16* (2006.01)
*H04R 29/00* (2006.01)

(52) U.S. Cl.
CPC ............... *H04R 3/04* (2013.01); *H03G 5/165* (2013.01); *H04R 29/001* (2013.01)

(58) Field of Classification Search
CPC ........ H04R 3/04; H04R 29/001; H03G 5/165; H03G 5/025; H03G 5/005; H03G 3/3005; H03G 3/20; H03G 3/00; H03G 1/00; H03G 1/04; H04S 7/307; H04S 7/301; G10L 19/008; G10L 21/0232; G10L 21/038; G10L 25/21
USPC .............................. 381/98, 103, 106; 375/229
See application file for complete search history.

(56) References Cited

U.S. PATENT DOCUMENTS

| | | | |
|---|---|---|---|
| 4,701,953 A | 10/1987 | White | |
| 4,739,514 A * | 4/1988 | Short | H03G 5/165 333/14 |
| 4,815,142 A * | 3/1989 | Imreh | H03G 9/18 381/106 |
| 7,194,096 B2 | 3/2007 | Graumann | |
| 7,317,800 B1 * | 1/2008 | Vierthaler | H03G 5/165 381/104 |
| 7,415,064 B2 | 8/2008 | Sivadas et al. | |
| 8,275,152 B2 * | 9/2012 | Smirnov | H03G 5/165 381/98 |
| 8,351,493 B2 | 1/2013 | Shakiba et al. | |
| 8,467,547 B2 | 6/2013 | Breitschadel | |

(Continued)

FOREIGN PATENT DOCUMENTS

| | | |
|---|---|---|
| RU | 2279758 C2 | 7/2006 |
| RU | 2284648 C2 | 9/2006 |

(Continued)

OTHER PUBLICATIONS

Giannoulis et al., "Digital dynamic range compressor design—A tutorial and analysis", Journal of the Audio Engineering Society, vol. 60, No. 6, pp. 399-408, Jun. 2012.

*Primary Examiner* — Ahmad F. Matar
*Assistant Examiner* — Sabrina Diaz
(74) *Attorney, Agent, or Firm* — Kligler & Associates Patent Attorneys Ltd

(57) ABSTRACT

An audio processing apparatus includes a digital filter, a signal combiner, and a dynamic-range processor (DRP). The digital filter is configured to receive a filter-input audio signal and to filter the filter-input audio signal, so as to produce a filter-output audio signal. The signal combiner is configured to combine the filter-input audio signal with the filter-output audio signal, so as to produce a combined audio signal. The DRP is configured to apply to the filter-output audio signal a dynamic-range correction that depends non-linearly on the combined audio signal.

18 Claims, 4 Drawing Sheets

(56) References Cited

U.S. PATENT DOCUMENTS

| | | | |
|---|---|---|---|
| 10,755,722 B2* | 8/2020 | You | H03G 9/18 |
| 2011/0110533 A1* | 5/2011 | Choi | H03G 9/18 |
| | | | 381/99 |
| 2012/0063614 A1 | 3/2012 | Crockett et al. | |
| 2012/0191462 A1* | 7/2012 | Aoki | H03G 9/025 |
| | | | 704/500 |
| 2015/0188602 A1* | 7/2015 | Groh | H03H 17/0267 |
| | | | 375/240 |
| 2015/0380005 A1* | 12/2015 | Chesney | G10L 19/04 |
| | | | 704/500 |
| 2018/0166090 A1* | 6/2018 | Tu | G10L 21/038 |
| 2018/0247633 A1* | 8/2018 | Wu | H04S 3/02 |

FOREIGN PATENT DOCUMENTS

| | | |
|---|---|---|
| WO | 2006047600 A1 | 5/2006 |
| WO | 2007120453 A1 | 10/2007 |
| WO | 2008105070 A1 | 9/2008 |

* cited by examiner

| Configurable DF-mimic mode | Gd-Gain of Dry signal | Gw-Gain of wet signal | DF-mimic characteristics at DRP input |
|---|---|---|---|
| A | 0 | 1 | ⌄ |
| B | 1 | -1 | ⌒ |
| C | 1 | 0 | — |

COMBINED FREQUENCY RESPONSE AND DYNAMIC RANGE CORRECTION FOR LOUDSPEAKERS

FIELD OF THE INVENTION

The present invention relates generally to processing of audio signals, and particularly to methods, systems and software for correction of audio signal distortions.

BACKGROUND OF THE INVENTION

Techniques for correcting audio signal distortions have been previously proposed in the patent literature. For example, U.S. Pat. No. 7,194,096 describe a method in which an input audio signal is analyzed to determine a power spectral density profile. The power spectral density profile is compared with at least one template profile. On the basis of the comparison, frequency bands of the input audio signal are selectively attenuated.

As another example, Russian patent RU 2,284,648 describes a method of automatic adaptive frequency correction of an audio signal. The method is characterized by forming a reference spectrum, determining the spectrum of the source signal, comparing the spectrum of the source signal and the reference spectrum, generating comparison signals depending on the comparison results, and then, using comparison signals, acting on the original signal for changes in the relations between its spectral components to correct a signal.

U.S. Pat. No. 8,467,547 describes an audio compressor that may regulate the level of an audio input signal depending on whether the level is above or below a threshold value. The audio compressor may control a pumping that is created when regulating a dynamic-range of an audio signal with the threshold value. A feedback loop connecting the signal output from the audio compressor with a release filter may be used to modify an effective release time of the signal. A controller may be used that allows a filter coefficient of the release filter to be controlled to adjust the effective release time as a function of the signal output.

SUMMARY OF THE INVENTION

An embodiment of the present invention provides an audio processing apparatus including a digital filter, a signal combiner, and a dynamic-range processor (DRP). The digital filter is configured to receive a filter-input audio signal and to filter the filter-input audio signal, so as to produce a filter-output audio signal. The signal combiner is configured to combine the filter-input audio signal with the filter-output audio signal, so as to produce a combined audio signal. The DRP is configured to apply to the filter-output audio signal a dynamic-range correction that depends non-linearly on the combined audio signal.

In some embodiments, the digital filter is configured to both (i) equalize the filter-input audio signal and (ii) apply a partial correction for a resonance effect occurring in a loudspeaker driven by the filter-output audio signal corrected by the DRP.

In some embodiments, the DRP is configured to apply a complementary correction to the resonance effect, in addition to the partial correction applied by the digital filter.

In an embodiment, prior to combining the filter-input audio signal with the filter-output audio signal, the signal combiner is configured to apply a first weight to the filter-input audio signal and a second weight to the filter-output audio signal.

In another embodiment, one or both of the first and second weights are user-configurable.

In some embodiments, in at least one operational mode of the signal combiner, the first weight is 1 and the second weight is −1. In other embodiments, the first weight is selectable from the set {0,1} and the second weight is selectable from the set {−1,0,1}.

In an embodiment, the DRP is configured to apply a non-zero dynamic-range correction only when a power level of the combined audio signal exceeds a threshold.

In some embodiments, the DRP includes one of a dynamic-range compressor (DRC), a limiter and an expander. There is additionally provided, in accordance with another embodiment, an audio processing method including receiving in a digital filter a filter-input audio signal and to filter the filter-input audio signal, so as to produce a filter-output audio signal. The filter-input audio signal is combined with the filter-output audio signal in a signal combiner, so as to produce a combined audio signal. Using a dynamic-range processor (DRP), a dynamic-range correction that depends non-linearly on the combined audio signal is applied to the filter-output audio signal.

The present invention will be more fully understood from the following detailed description of the embodiments thereof, taken together with the drawings in which:

DETAILED DESCRIPTION OF EMBODIMENTS

Overview

Figure 1:
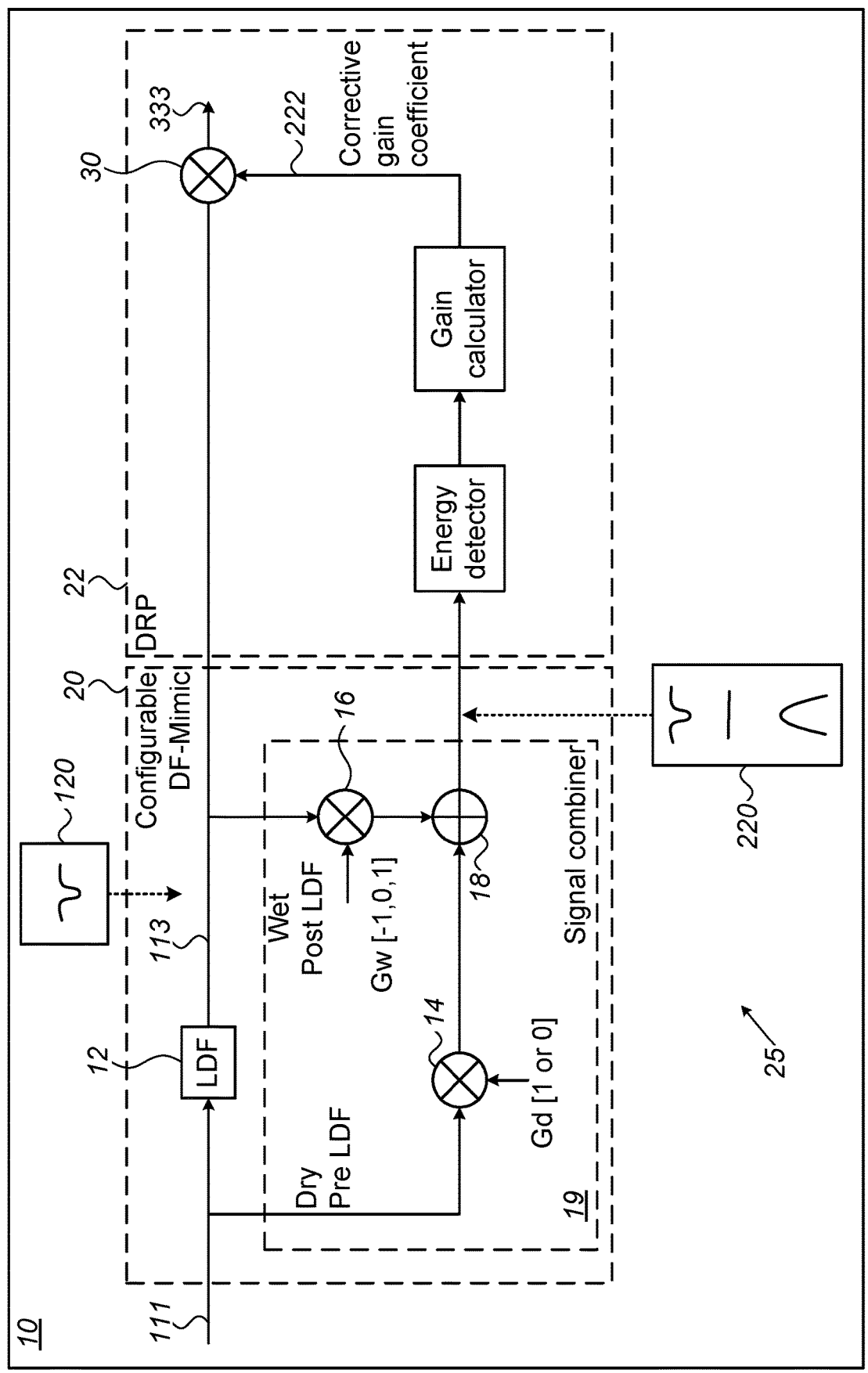
FIG. 1 is a block diagram schematically illustrating an audio processing apparatus comprising a configurable digital filter mimic (DF-mimic) and a dynamic-range processor (DRP), in accordance with an embodiment of the present invention.

Manufacturers of consumer-grade loudspeakers, in particular those fitted in mobile devices, face the challenge of balancing sufficient audio quality with price. Particularly challenging are small plastic loudspeaker enclosures, common in the consumer electronics market, which are prone to suffer from audio resonance phenomena. For example, a common audio quality problem may occur when a loudspeaker box, such as fitted inside, e.g., a mobile phone, undesirably "resonates" at a specific frequency. In such a case the outputted acoustic energy at the resonance frequency is significantly higher than expected, and also higher than on other frequencies. Such an effect is commonly thought to occur due to air pressure resonance created within the loudspeaker's enclosure and is, as mentioned above, an unwanted audio artifact.

Moreover, such resonance effects (e.g., standing waves in an enclosure) can build up in a non-linear way. For example, a common problem in the consumer electronics field is for a loudspeaker to produce less noticeable audio resonance when input signal amplitudes are low (e.g., producing a low audio amplitude "peak" below a threshold value), and having the amplitude of the unwanted audio resonant artifact growing non-linearly with input signal amplitude, in the range above the threshold value.

One possible way to solve the above audio frequency and power related problems is by digital signal-processing (DSP) techniques, for example by applying to the input signal a digital-filter (DF) and a dynamic-range processor (DRP). The DRP may include such options as a dynamic-range compressor (DRC), a limiter or an expander, among others. However, this solution is often too expensive to be fully implemented, as such dedicated DF and DRP combinations increase complexity as well as computational and electrical-power consumption. Moreover, when taking into account that audio resonance may occur at multiple frequencies, as well as the need to solve other audio problems, in many cases it is impractical to include a sufficient number of additional dedicated DF and DRC pairs in a consumer device, to solve every resonance problem.

Embodiments of the present invention that are described hereinafter provide an apparatus that utilizes one or more digital filters already comprised in the consumer device (e.g., in an equalizer unit of the device) to also function, in addition to their original uses, as DFs that provide DF inputs to DRPs. To facilitate this dual use, the disclosed technique combines the filter-input audio signal with the filter-output audio signal, using a signal combiner. The combined signal is provided as input to the DRP. Acting together, the digital filter and the signal combiner are collectively named hereinafter "configurable DF-mimic." As the signal combiner includes substantially fewer elements than a dedicated DF, and considering the multiple dedicated DFs that might otherwise have been required, the embodiments of the disclosed invention can save significant hardware and software resources in the device.

Moreover, the disclosed DF-mimic technique extends the possibilities of the apparatus to handle other audio-quality issues, by providing, e.g., using the equalizer's digital filter, a configurable equivalent of the DF, thereby implementing a configurable signal correction circuitry (i.e., using combined configurable-DF-mimic and DRP). As an equalizer may include multiple digital filters, the disclosed technique enables multiple configurable signal correction circuitry (i.e., combinations of DF mimics and respective DRPs) of this type using already existing filters.

As noted above, a key ingredient of the disclosed technique is to combine the filter input and filter output signals. Therefore, in some embodiments, the disclosed audio processing apparatus includes (a) the aforementioned digital filter (typically a linear DF) comprised in the device (e.g., a linear DF comprised in an equalizer of the device), wherein the DF is configured to receive a filter-input audio signal and to filter the filter-input audio signal so as to produce a filter-output audio signal, (b) a signal combiner, configured to combine the filter-input audio signal with the filter-output audio signal, so as to produce a combined audio signal of the above-described DF-mimic, and (c) an existing DRP (e.g., a DRC) configured to apply a dynamic-range correction to the filter-output audio signal that depends non-linearly on the combined audio signal.

In one embodiment, the above-mentioned digital filter is configured to apply a partial correction to a resonance effect occurring in a loudspeaker driven by the filter-output audio signal. The signal combiner is configured to apply a first weight to the filter-input audio signal and a second weight to the filter-output audio signal and output the combined signal to the DRP. The DRP is then configured to apply a complementary correction to the resonance effect, in addition to the partial correction applied by the digital filter.

As further noted above, the disclosed technique is configurable and, in another embodiment, one or both of the first and second weights are configurable per device model. For example, the disclosed solution may be provided with a state table for the configurable DF-mimic, in which the first and second weights are selected to form different combinations. The different possible combinations greatly expand the capabilities of a signal correction circuitry to perform DSP operations to overcome loudspeaker imperfections, as well as backward-compatibility and testing capabilities. For example, in one embodiment, the disclosed configurable DF-mimic is configured to serve as a band-pass filter (BPF). In another example, the disclosed configurable DF-mimic is configured to serve as a band-stop filter (BSF).

By providing audio control with combined DF-mimic and DRP solutions comprising configurable DF-mimics using available digital-filters in a device, the disclosed technique fills the requirements of providing improved audio quality control in consumer-grade devices while maintaining low complexity, and low computational and electrical-energy requirements.

Combined Frequency Response and
Dynamic-Range Corrector for Loudspeaker Correction As noted above, in some consumer devices, a spectrally-uniform input audio signal may nevertheless generate a loudspeaker resonance at a certain frequency. Had the resonance amplitude been a linear function of the input signal amplitude, the audio resonance could have been more readily mitigated by using a digital filter. For example, assuming a relative peak resonance of S decibels, a digital filter having a frequency response comprising a (−S) [dB] notch at the resonant frequency would have resolved the problem by canceling the audio resonance.

In many practical cases, however, S is not a fixed value, since the resonance tends to be weak at low input signal amplitudes and to grow as input signal amplitude increases. To compensate for such a dependence of S, a combination of a DF and DRP functionally is required, which, without the disclosed embodiments of the invention, require an apparatus comprising a dedicated DF on an input path to a DRP.

FIG. 1 is a block diagram schematically illustrating an audio-processing apparatus 10 comprising a signal correction circuitry 25 comprising configurable digital filter mimic (DF-mimic) 20 and a dynamic-range processor (DRP) 22, in accordance with an embodiment of the present invention. Processing apparatus 10 may be used in any suitable system or device that outputs audio signals, e.g., in a mobile phone, a computer, a gaming console or a stereo system, to name only a few possibilities.

Processing apparatus 10 has a feed-forward topology in which, responsively to an analyzed filter-input audio signal 111, a dynamic-range correction (e.g., a corrective gain coefficient) is calculated and applied (222) to generate an output audio signal 333 in which undesired resonance effects are suppressed considerably.

In more detail, signal correction circuitry 25 comprises a configurable DF-mimic module 20 that outputs a combined audio signal 220 for use as an input of a Dynamic-Range Corrector (DRP) 22. Responsively to the combined signal, DRP 22 calculates a gain coefficient 222 that is the output of signal correction circuitry in 25. In the shown embodiment, configurable DF-mimic 20 is realized by a linear digital filter (LDF) 12 and by a signal combiner 19 to implement the disclosed signal correction circuitry 25 functionality.

LDF 12, usually a second order filter, usually of the type "Direct Form 1" (DF1) or "direct Form 2" (DF2) or similar, is shown in FIG. 1 as a non-limiting example. Typically, LDF 12—or any other filter type used—is one of a set of filters of an equalizer unit (not shown). LDF 12 plays a dual role in apparatus 10—(i) Equalizes input audio signal 111, and (ii) applies partial correction for loudspeaker resonance. Other equalizer unit filters may also be used, e.g., in parallel to LDF 12, to solve other audio quality issues. For example, other available digital filters may be comprised in configurable DF-mimics to solve other aforementioned loudspeaker resonances occurring at other frequencies.

As noted above, in the shown embodiment, adding a dedicated DF is avoided since apparatus 10 comprises signal combiner 19 configured to combine a filter-input audio signal 111 (also called "Dry Pre LDF" signal) with a filter-output audio signal 113 (also called "Wet Post LDF" signal), so as to produce a combined audio signal 220 of DF-mimic 20. As seen, LDF 12 input signals and output signals are combined (e.g., by adder 18), after the two signals are multiplied with respective first and second weights $G_d$ and $G_w$, which are described in FIG. 2.

Figure 4:
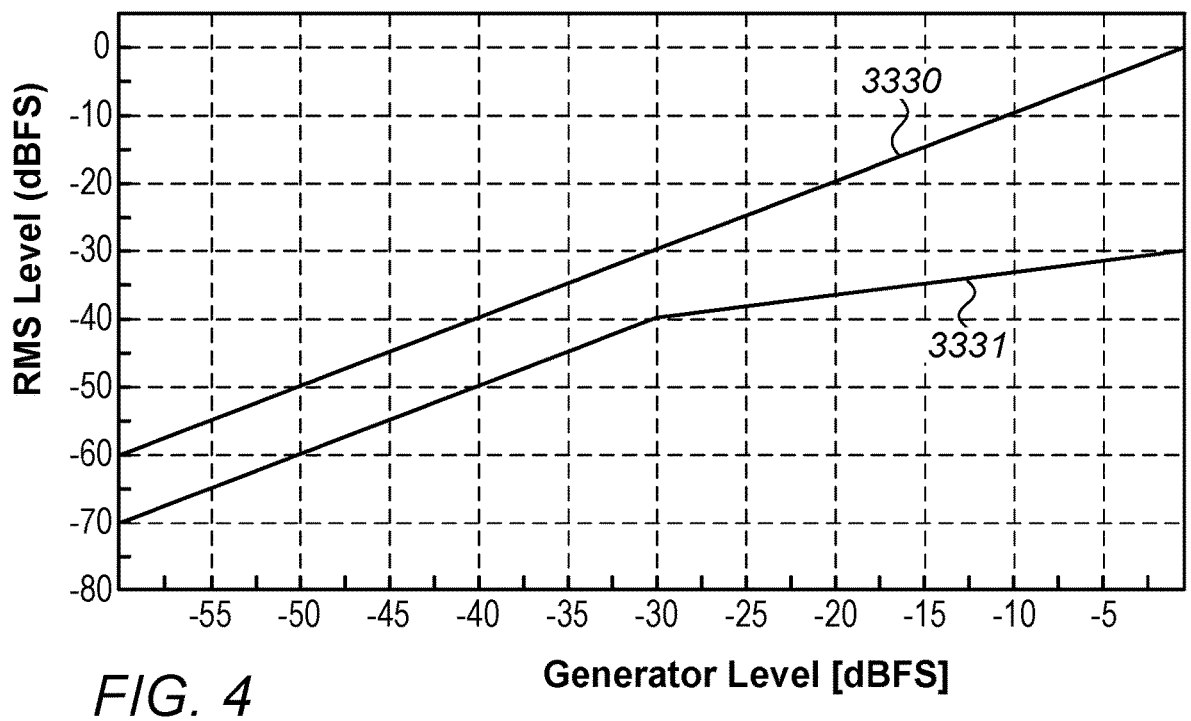
FIG. 4 is a graph of the output signal of the apparatus of FIG. 1 both with and without resonance correction using the combined signal of FIG. 3, in accordance with an embodiment of the present invention.

In response to combined audio signal 220 of DF-mimic 20, DRP 22 is configured to apply (222) a dynamic-range correction to filter-output audio signal 113 that depends non-linearly on combined audio signal 220. The resulting audio output, as shown in FIG. 4, is essentially the same as if a dedicated BPF had been added to signal correction circuitry 25. Since a dedicated BPF includes significantly more elements than signal combiner 19, and since multiple dedicated BPFs may have been needed in a single device, the disclosed technique can save significant hardware and software resources.

The example embodiment of FIG. 1 is depicted by way of example, and in a simplified way, for the sake of clarity. For example, other types of digital filters may be used by the disclosed technique, such as a single-pole filter, a three-pole or any other number of poles filter, LPF, BPF of any order, finite impulse response (FIR) filters, etc. Additional elements of apparatus 10, such as other components of the equalizer unit, and audio amplification stages, are not described for clarity of presentation.

In various embodiments, the different elements of the audio processing apparatus shown in FIG. 1 may be implemented using suitable hardware, such as using one or more discrete components, one or more Application-Specific Integrated Circuits (ASICs) and/or one or more Field-Programmable Gate Arrays (FPGAs). Some of the functions of the disclosed audio processing apparatuses, e.g., some or all functions of DF-mimic 20 and DRP 22, may be implemented in one or more general purpose processors, which are programmed in software to carry out the functions described herein. The software may be downloaded to the processors in electronic form, over a network or from a host, for example, or it may, alternatively or additionally, be provided and/or stored on non-transitory tangible media, such as magnetic, optical, or electronic memory.

Figures 2, 3:
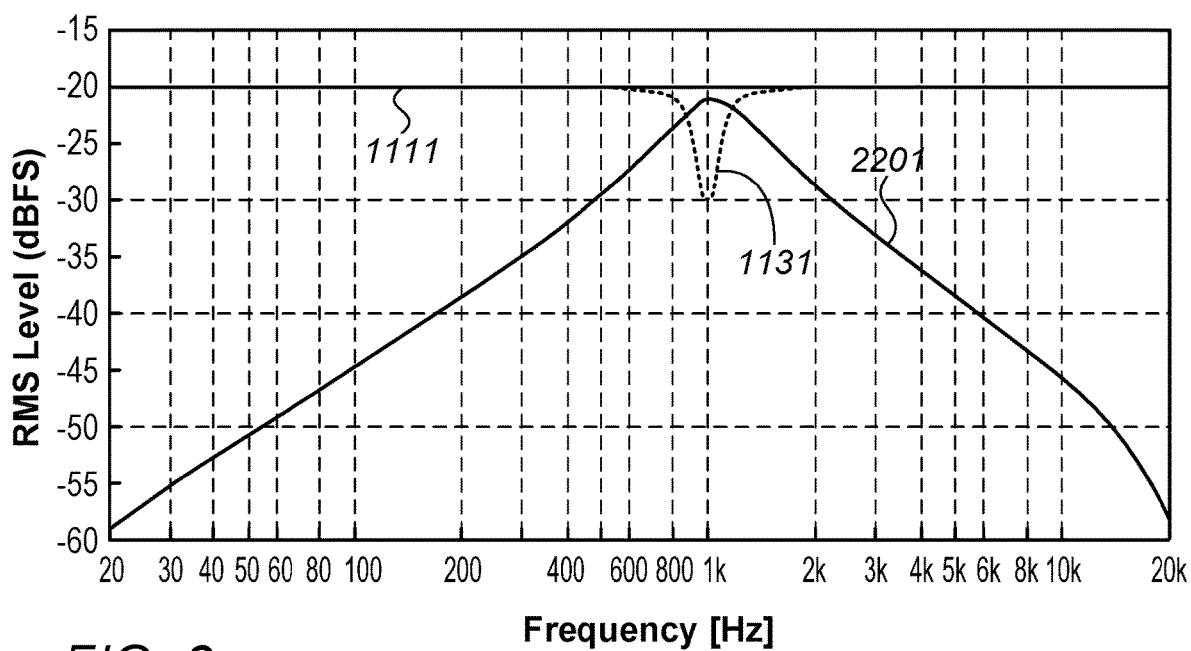
FIG. 2 is a state table for a signal combiner comprised in the configurable digital filter mimic (DF-mimic) of FIG. 1, in accordance with an embodiment of the present invention.
FIG. 3 is a graph of filter-input signal characteristic and filter-output signal characteristic, as well as of an actual combined signal, in accordance with an embodiment of the present invention.

FIG. 2 is a state table for the signal combiner 19 comprised in configurable digital filter mimic (DF-mimic) 20 of FIG. 1, in accordance with an embodiment of the present invention. As seen, the state table comprises three modes (A, B, C) for configuring DF-mimic 20. The table includes first and second weights $G_d$ and $G_w$ values, that, by way of example, are selected to be either zero or ±1.

Setting $G_d$ to +1 and $G_w$ to −1 ("mode B" of the table) generates a BPF-like response curve of DF-mimic 20, for proper selection of LDF 12, such as selecting direct-form 1 (DF1) or direct-form 2 (DF2) filters and setting the selected filter to function as a notch filter. The BPF response achieved in "mode B" is typically the most desired shape for the input of DRP 22. This is because the resulting BPF characteristics (which serves as input DRP 22) is particularly sensitive to the resonant frequency, less to other frequencies.

However, the user may still want to use "mode A" in which weights $G_d$ and $G_w$ are set to have DF-mimic 20 outputs the same output as that of LDF 12. This is the same design as in existing systems in which the linear filter is placed before the DRP and can be used for backward compatibility if this solution is good enough.

Another option is using "mode C" in which weights $G_d$ and $G_w$ are set to have DF-mimic 20 provide a frequency-flat input to DRP 22. This is the same design as in existing systems in which the linear filter is placed after the DRC and can be used for backward compatibility if this solution is good enough.

With these three modes, the user can easily set up an existing apparatus 10 to operate in one of three modes:

Mode B: sensitive to resonant frequency

Mode A: mimic a linear filter before the DRC (cascaded design)

Mode C: mimic the linear filter after the DRC (cascaded design)

These three modes are achieved with a minimum of components added to the device to form apparatus 10 (mainly to form signal combiner 19), yielding low computational resource requirements and high functional flexibility.

In general, first and second weights $G_d$ and $G_w$ can have other values, and depending on the values of the first and second weights $G_d$ and $G_w$, configurable DF-mimic 20 can be preset to have any characteristics between a strong BPF (e.g., after "mode B") to a strong BSF (e.g., after "mode A").

For the sake of clarity of presentation, the above treatment is given mostly in general terms. As a complement, FIGS. 3 and 4 provide a few specific practical implementations, using non-trivial parameters, and further provide real-time results measured with a standard spectrum analyzer to reflect the output of a real apparatus employing the disclosed technique.

All results discussed in this paragraph were measured (in real-time) by an Audio Precision AP525 audio analyzer, accepted in this industry as a standard. The results below include both FR (frequency response) and DR (dynamic-range) measurements of two embodiments of the application, implemented in software on a Windows® 10 PC and run with real-time audio design tools.

FIG. 3 is a graph of filter-input signal characteristic (1111) and filter-output signal characteristic (1131), as well as of an actual combined signal 2201, in accordance with an embodiment of the present invention.

In FIG. 3 apparatus 10 is configured to correct an audio resonance occurring at a frequency of 1 [KHz], that a flat input signal 1111 generates due to, for example, the aforementioned device enclosure imperfection. In the given example, there is a need to attenuate the output signal at a 1 [KHz] frequency region to be no more than (−20) [dB], without affecting other frequency regions.

Moreover, the specific frequency region of 1 [KHz] should be attenuated by at least 10 [dB] along all of the dynamic-range of the input signal. In this non-limiting example, the resonant artifacts become more and more dominant as the input goes over (−30) [dB].

To sum up the challenge, it requires the disclosed apparatus to limit the system in this manner:
  All frequencies except for 1 [KHz] region have no limit on FR or DR
  The amplitude at frequency region of 1 [KHz] should not pass (−20) [dB] even if input is maximum (e.g., 0 [dB])
  The frequency region of 1 [KHz] should have a linear attenuation of (−10) [dB] as long as the input level (at around the frequency 1 [KHz]) is lower than (−30) [dB]
Thus, apparatus 10 should reduce output amplitude 333 about the resonant frequency only, and particularly, if the resonance amplitude becomes too high.

To achieve a combined signal 2201 seen in FIG. 3 that meets the above requirements, the apparatus is configured with a linear digital filter having a gain of (−10) [dB] at 1 [KHz], which, by selecting the Q-factor of the digital filter sufficiently high (in this case Q is set equal to 12), produces a notch frequency response curve as seen by signal 1131.

DRC 22 can now be configured to attenuate a resonance by using the BPF-mimic frequency-response that DF-mimic 20 was configured to supply. In particular, DRC 22 is configured to output (222) a gain coefficient that is used by multiplier 30 to further attenuate the already partially attenuated resonance audio resonance.

To achieve this result, the DRP parameters are set as follows: a threshold=(−30) [dB], and a ratio=1:1.5, where the DRP input/output ratio determines a compression ratio of signal intensity above the threshold level (e.g., for a signal 0 [dB] signal, which is [30 dB] above the threshold, the ratio means the DRP will attenuates the signal by 20 [dB] on top of the 10 [dB] suppression provided by the filter). Other DRP settings, such as pre-gain, post-gain, attack, release, knee, etc. are not mentioned here in order to simplify the discussion.

FIG. 4 is a graph of the output signal of the apparatus of FIG. 1 without (3330) resonance correction and with resonance correction (3331) using the combined signal 2201 of FIG. 3, in accordance with an embodiment of the present invention. As seen, output signal 3331 of apparatus 10 at 1 [KHz] (after being corrected by a corrective gain coefficient 222 outputted by DRP 22) has a knee at −30 [dB]. Compared to the uncorrected signal 3330, output signal 3331 is 10 [dB] attenuated for input-signal amplitude lower than −30 [dB], and, as input-signal amplitude crosses the threshold, DRP 22 increasingly attenuates signal 3331 to eliminate an otherwise increasing resonant amplitude of the loudspeaker signal (not shown) between −30 [dB] and 0 [dB] input amplitude.

When inspecting frequencies other than resonance frequency (e.g., inspecting audio quality at 10 [KHz]), the equivalent of signals 3330 and 3333 are practically identical, as both the digital filter and the RDCR have no effect.

To demonstrate the flexibility of the disclosed apparatus, another implementation of resonance suppression at 1 [Khz] is presented, in which the disclosed apparatus should not give more than a (−35) [dB] output signal. At the specific frequency region of 1 [KHz] the signal should be attenuated by at least 15 [dB] along the entire dynamic-range of the input signal. In this additional non-limiting example, the resonant artifacts become more and more dominant as the input goes over (−40) [dB].

To achieve the above requirements, the apparatus is configured with a linear digital filter having a gain of (−15) [dB] at 1 [KHz] and Q-factor of 12. The DRP parameters are set as threshold=(−40) [dB], and ratio=1:2.

Figure 5:
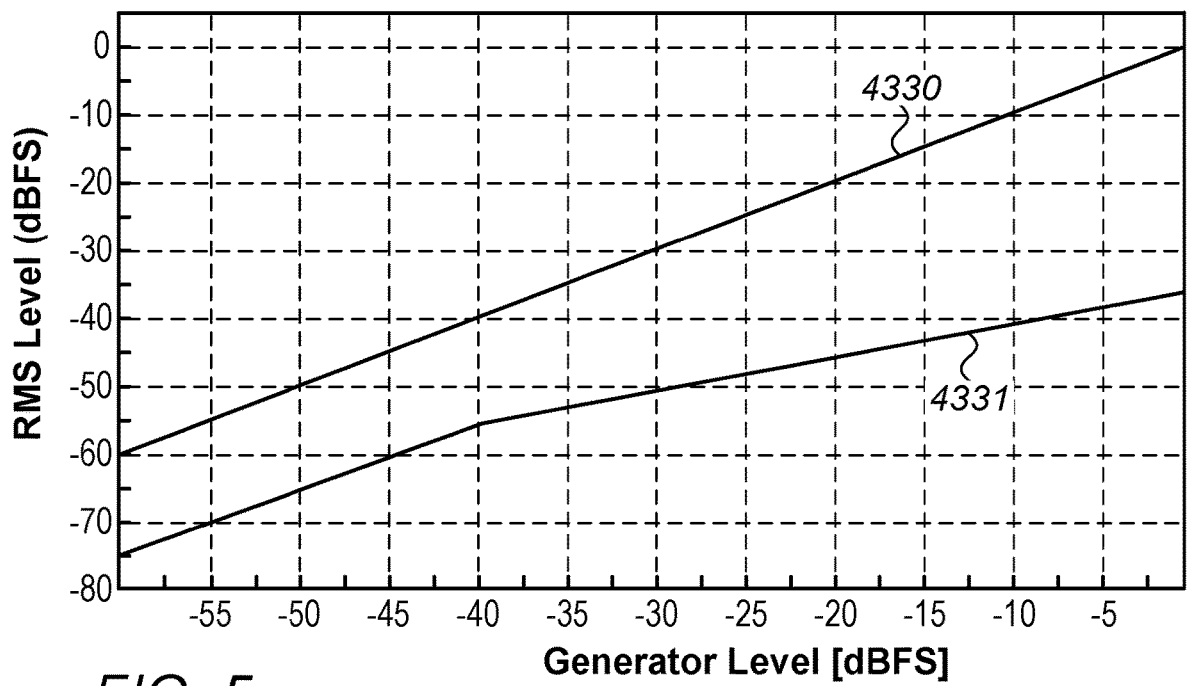
FIG. 5 is a graph of the output signal of the apparatus of FIG. 1, both with and without a resonance correction, in accordance with another embodiment of the present invention.

Accordingly, FIG. 5 is a graph of the output signal of apparatus 10 of FIG. 1, without (4330) and with (4331) the resonance correction, in accordance with another embodiment of the present invention.

As seen in FIG. 5, output signal 4331 of apparatus 10 at 1 [KHz] (after being corrected by a corrective gain coefficient 222 outputted by DRP 22) has a knee at −40 [dB] input-signal amplitude. Compared with the uncorrected signal 4330, output signal 4331 is 15 [dB] attenuated for input-signal amplitude lower than −40 [dB], and, as input-signal amplitude crosses the threshold, DRP 22 increasingly attenuates signal 4331, to eliminate an otherwise increasing resonant amplitude of the loudspeaker signal (not shown) between −40 [dB] and 0 [dB] input amplitude.

Figure 6:
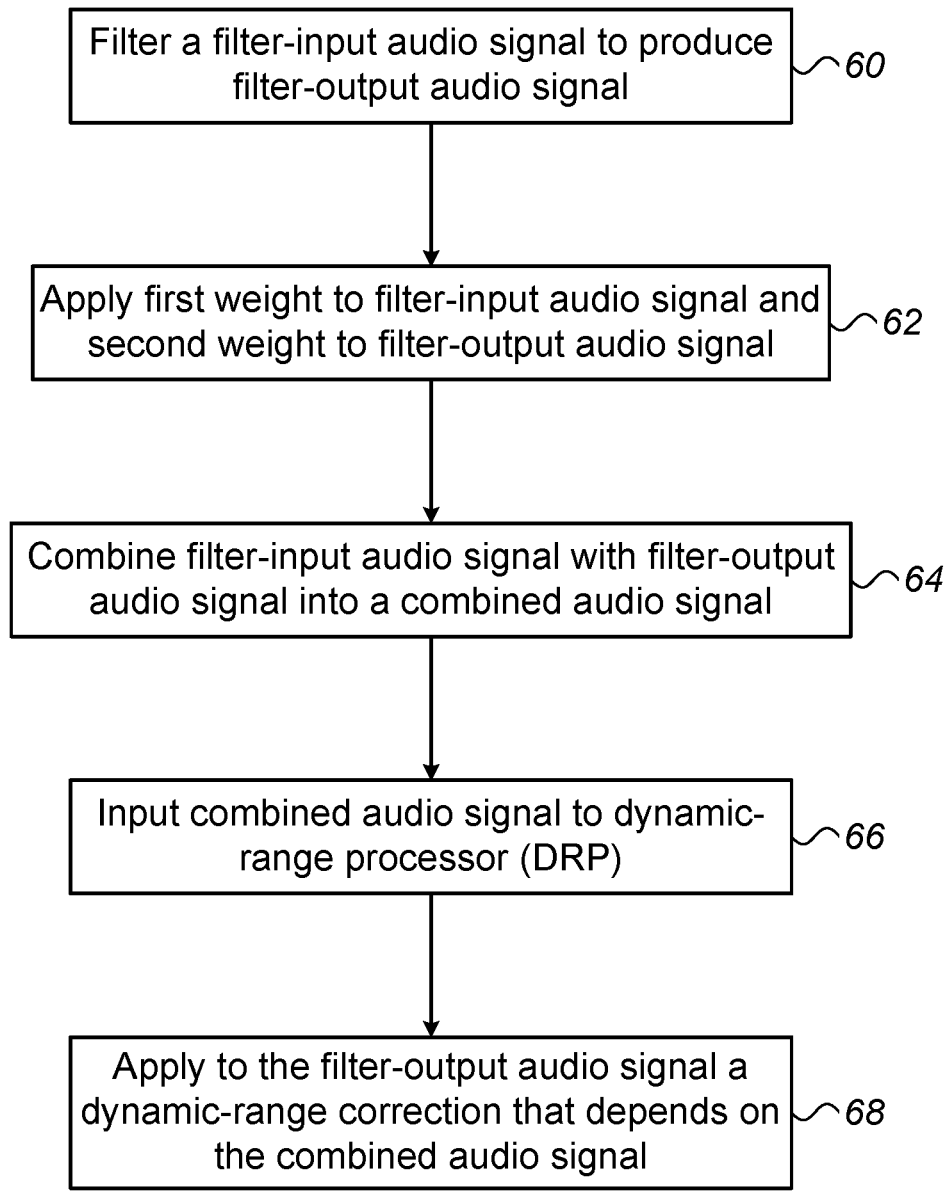
FIG. 6 is a flow chart that schematically illustrates a method for correcting an audio output signal using the audio processing apparatus of FIG. 1, in accordance with an embodiment of the present invention.

FIG. 6 is a flow chart that schematically illustrates a method for correcting an audio output signal using the audio processing apparatus of FIG. 1, in accordance with an embodiment of the present invention. The algorithm, according to the presented embodiment, carries out a process that begins with filter 12 of apparatus 10 filtering a filter-input audio signal 111 to produce a filter-output signal 113, at a digital filtration step 60.

At a signal weighting step 62, signal combiner 19 applies a first weight, $G_d$, to the filter-input audio signal and applies a second weight, $G_w$, to the filter-output audio signal. Next, at a signal combining step 64, signal combiner 19 combines the weighted signals using adder 18.

At DRP inputting step 66, adder 18 outputs the combined signal (120) into an input port of DRP 22, which, at a corrective gain application step 68, applies, using multiplier 30, a dynamic-range correction signal (222) to the filter-output audio signal 113 that depends on the combined audio signal, to suppress an audio resonance.

Although the embodiments described herein mainly address audio processing for consumer grade devices, the methods and systems described herein can also be used in other applications, such as in music instruments with internal loudspeakers, such as digital pianos, and in portable audio (PA) systems, amplified speakers for pro-audio (studio monitors), etc.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An audio processing apparatus, comprising:
a digital filter, configured to receive a filter-input audio signal and to filter the filter-input audio signal, so as to produce a filter-output audio signal;
a signal combiner, configured to combine the filter-input audio signal with the filter-output audio signal, so as to produce a combined audio signal; and
a dynamic-range processor (DRP), configured to apply to the filter-output audio signal a dynamic-range correction that depends non-linearly on the combined audio signal.

2. The apparatus according to claim 1, wherein the digital filter is configured to both (i) equalize the filter-input audio signal and (ii) apply a partial correction for a resonance effect occurring in a loudspeaker driven by the filter-output audio signal corrected by the DRP.

3. The apparatus according to claim 2, wherein the DRP is configured to apply a complementary correction to the resonance effect, in addition to the partial correction applied by the digital filter.

4. The apparatus according to claim 1, wherein, prior to combining the filter-input audio signal with the filter-output audio signal, the signal combiner is configured to apply a first weight to the filter-input audio signal and a second weight to the filter-output audio signal.

5. The apparatus according to claim 4, wherein one or both of the first and second weights are user-configurable.

6. The apparatus according to claim 4, wherein, in at least one operational mode of the signal combiner, the first weight is 1 and the second weight is −1.

7. The apparatus according to claim 4, wherein the first weight is selectable from the set $\{0,1\}$ and the second weight is selectable from the set $\{-1,0,1\}$.

8. The apparatus according to claim 1, wherein the DRP is configured to apply a non-zero dynamic-range correction only when a power level of the combined audio signal exceeds a threshold.

9. The apparatus according to claim 1, wherein the DRP comprises one of a dynamic-range compressor (DRC), a limiter and an expander.

10. An audio processing method, comprising:
filtering a filter-input audio signal, so as to produce a filter-output audio signal;
combining the filter-input audio signal with the filter-output audio signal, so as to produce a combined audio signal; and
applying to the filter-output audio signal a dynamic-range correction that depends non-linearly on the combined audio signal.

11. The method according to claim 10, wherein filtering the filter-input audio signal comprises both (i) equalizing the filter-input audio signal and (ii) applying a partial correction for a resonance effect occurring in a loudspeaker driven by the dynamic-range corrected filter-output audio signal.

12. The method according to claim 11, wherein applying the dynamic-range correction comprises applying a complementary correction to the resonance effect, in addition to the partial correction applied in filtering the filter-input audio signal.

13. The method according to claim 10, and comprising, prior to combining the filter-input audio signal with the filter-output audio signal, applying a first weight to the filter-input audio signal and a second weight to the filter-output audio signal.

14. The method according to claim 13, wherein one or both of the first and second weights are user-configurable.

15. The method according to claim 13, wherein, in at least one operational mode of the signal combiner, the first weight is 1 and the second weight is −1.

16. The method according to claim 13, wherein the first weight is selectable from the set $\{0,1\}$ and the second weight is selectable from the set $\{-1,0,1\}$.

17. The method according to claim 10, wherein applying the dynamic-range correction comprises applying a non-zero dynamic-range correction only when a power level of the combined audio signal exceeds a threshold.

18. The method according to claim 10, wherein applying the dynamic-range correction comprises applying one of a dynamic-range compression, a dynamic-range limitation and a dynamic-range expansion.

* * * * *